(12) United States Patent
Clements et al.

(10) Patent No.: US 7,698,802 B2
(45) Date of Patent: Apr. 20, 2010

(54) METHOD FOR MANUFACTURING A CALIBRATION DEVICE

(75) Inventors: Steven M. Clements, Raleigh, NC (US); William P. Cornwell, Durham, NC (US); Carrie E. Cox, Cary, NC (US); Hayden C. Cranford, Jr., Cary, NC (US); Vernon R. Norman, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 12/028,439

(22) Filed: Feb. 8, 2008

(65) Prior Publication Data

US 2008/0120838 A1 May 29, 2008

Related U.S. Application Data

(62) Division of application No. 11/262,101, filed on Oct. 28, 2005, now Pat. No. 7,368,902.

(51) Int. Cl.
*G01R 31/28* (2006.01)
(52) U.S. Cl. .............. 29/593; 29/832; 29/842; 29/846; 29/854; 324/158.1; 324/601; 326/30; 363/95; 702/107
(58) Field of Classification Search ............ 29/593, 29/832, 842, 846, 854; 324/158.1, 601; 326/30; 363/95; 702/107
See application file for complete search history.

(56) References Cited

U.S. PATENT DOCUMENTS

| | | | | |
|---|---|---|---|---|
| 6,807,650 B2 * | 10/2004 | Lamb et al. | | 716/1 |
| 6,940,303 B2 * | 9/2005 | Vargas | | 326/30 |
| 6,958,613 B2 * | 10/2005 | Braun et al. | | 324/601 |
| 7,386,410 B2 * | 6/2008 | Boskovic | | 702/107 |

FOREIGN PATENT DOCUMENTS

JP 200124497 A 1/2001

* cited by examiner

*Primary Examiner*—Paul D Kim
(74) *Attorney, Agent, or Firm*—Dillon & Yudell LLLP

(57) ABSTRACT

A method for manufacturing a calibration device for an active circuit on a chip, comprises: providing an active circuit that is capable of exhibiting a desired electrical characteristic; and providing a calibration mechanism on-chip with the active circuit. The calibration mechanism generates a control output and comprises a device under test (DUT) configured as a replica of at least one segment of the active circuit, and which generates a test output that causes finite adjustments to the control output, based on a comparison of the electrical characteristics exhibited by the DUT with a known electrical characteristic. The method further comprises: attaching to each control input terminal of the active circuit a corresponding control output from the calibration mechanism. The control output of the calibration mechanism dynamically adjusts control input applied to devices of the active circuit to force the active circuit to exhibit the desired electrical characteristic.

7 Claims, 5 Drawing Sheets

METHOD FOR MANUFACTURING A CALIBRATION DEVICE

PRIORITY CLAIM

The present application is a divisional of U.S. patent application Ser. No. 11/262,101, filed on Oct. 28, 2005 now U.S. Pat. No. 7,368,902 and entitled, "Impedance Calibration For Source Series Terminated Serial Link Transmitter," the contents of which is incorporated herein by reference.

BACKGROUND OF THE INVENTION

1. Technical Field

The present invention relates generally to electronic devices and in particular to calibration of electronic devices. Still more particularly, the present invention relates to a method, system, and electronic circuit for providing impedance calibration of electronic devices.

2. Description of the Related Art

Conventional HSS (high speed serializer/deserializer) standards require a transmitter have a differential output impedance in the range of 100 Ohms plus-or-minus (±)20% or better. The more accurate the output impedance (i.e., the smaller the percentage variance around the 100 Ohms), the better (more predictable and accurate) are the operating characteristics of the transmitter. Typically, the measured output impedance is provided by a resistor along with other circuit components (e.g., transistors), with measurable impedance characteristics. The resistor is frequently series-connected to the other components, which themselves may be either series or parallel connected to each other.

A source-series transmitter (SST) (or an inverter driver), is one example transmitter that is required to comply with this differential output impedance standard. With an SST, the output impedance typically consists of field effect transistor (FET) impedance in series with a resistor. FET impedance varies on the order of ±400% across different processes and allowable ASIC (application-specific integrated circuit) voltage variations. Thus, when the FET impedance represents a large enough portion of the overall output impedance, the (variable) FET impedance may easily cause the output impedance to fall out of the required range (i.e., ±20%) for differential output impedance.

The majority of voltage-mode transmitter implementations utilize very large FETs, which provide negligible FET impedance relative to the series connected resistor. These large FETs operate well at lower frequencies, but are not designed to handle the faster (high speed) transmission frequencies desired for current high speed applications (e.g., applications with transmission rates above 3 Gbps, non-return to zero (NRZ) data stream). Thus, smaller transistors, which support the higher speed rating are desired for most devices/applications currently being designed. These smaller transistors exhibit much larger impedances that may cause the circuit device to fall out of the desire range of output impedance.

Designing a transmitter that provides the output impedance characteristics while enabling the faster transmission rates via use of the smaller FETs requires some method of determining when the device being designed meets the requirements for the output impedance characteristics. A need therefore exists for an accurate, reliable process of calibrating a device, such as the transmitter, to meet particular output impedance requirements. This need is addressed by the present invention.

SUMMARY OF THE INVENTION

Disclosed is a method, system and circuit device that enables reliable and substantially accurate calibration of the output impedance of a device-under-test (DUT) to within a predetermined range of allowable output impedance. The electrical characteristics of a DUT are controlled by a feedback control signal such that a desired electrical characteristic is achieved. To achieve the particular electrical characteristic, the DUT is fed a control input that is also applied to an active circuit. One or more reference voltages are compared with the output voltage of the DUT and, based on the comparison, an adjustment is made to the control signal that is fed back to the DUT and to the active circuit. When the comparisons yield a desired output, the DUT is calibrated to the desired electrical characteristic. The control signal is then applied to the active circuit which consequently exhibits the desired electrical characteristic.

In one embodiment, the DUT is part of an inverter circuit that is configured as a source series terminated (SST) serial link transmitter. In the SST transmitter, two branches of parallel transistors each provide an impedance value when particular transistors of the parallel branch are turned on. The impedance value is added to a series connected resistor value to provide the output impedance. The DUT consists of one branch of parallel transistors in series with a resistor. The output impedance of the DUT is compared to the resistance of a reference resistor. A comparator compares the electrical characteristics of the DUT relative to the reference resistance and provides a control signal based on whether the output impedance falls within the pre-set percentage variance of the reference resistance. The control signal is processed by a FSM (finite state machine) that operates to individually turn on or off the transistors within the parallel branch until the DUT impedance value falls within the desired range.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

The present invention provides a method, system and circuit device that enables reliable and substantially accurate calibration of the output impedance of a device-under-test (DUT) to within a predetermined range of allowable output impedance. The electrical characteristics of a DUT are controlled by a feedback control signal such that a desired electrical characteristic is achieved. To achieve the particular electrical characteristic, the DUT is fed a control input that is also applied to an active circuit. One or more reference voltages are compared with the output voltage of the DUT and, based on the comparison, an adjustment is made to the control signal that is fed back to the DUT and to the active circuit. When the comparisons yield a desired output, the DUT is calibrated to the desired electrical characteristic. The control signal is then applied to the active circuit which consequently exhibits the desired electrical characteristic.

In one embodiment, the DUT is part of an inverter circuit that is configured as a source series terminated (SST) serial link transmitter. In the SST transmitter, two branches of parallel transistors each provide an impedance value when particular transistors of the parallel branch are turned on. The impedance value is added to a series connected resistor value to provide the output impedance. The DUT consists of one branch of parallel transistors in series with a resistor. The output impedance of the DUT is compared to the resistance of a reference resistor. A comparator compares the electrical characteristics of the DUT relative to the reference resistance and provides a control signal based on whether the output impedance falls within the pre-set percentage variance of the reference resistance. The control signal is processed by a FSM (finite state machine) that operates to individually turn on or off the transistors within the parallel branch until the DUT impedance value falls within the desired range.

Figure 1:
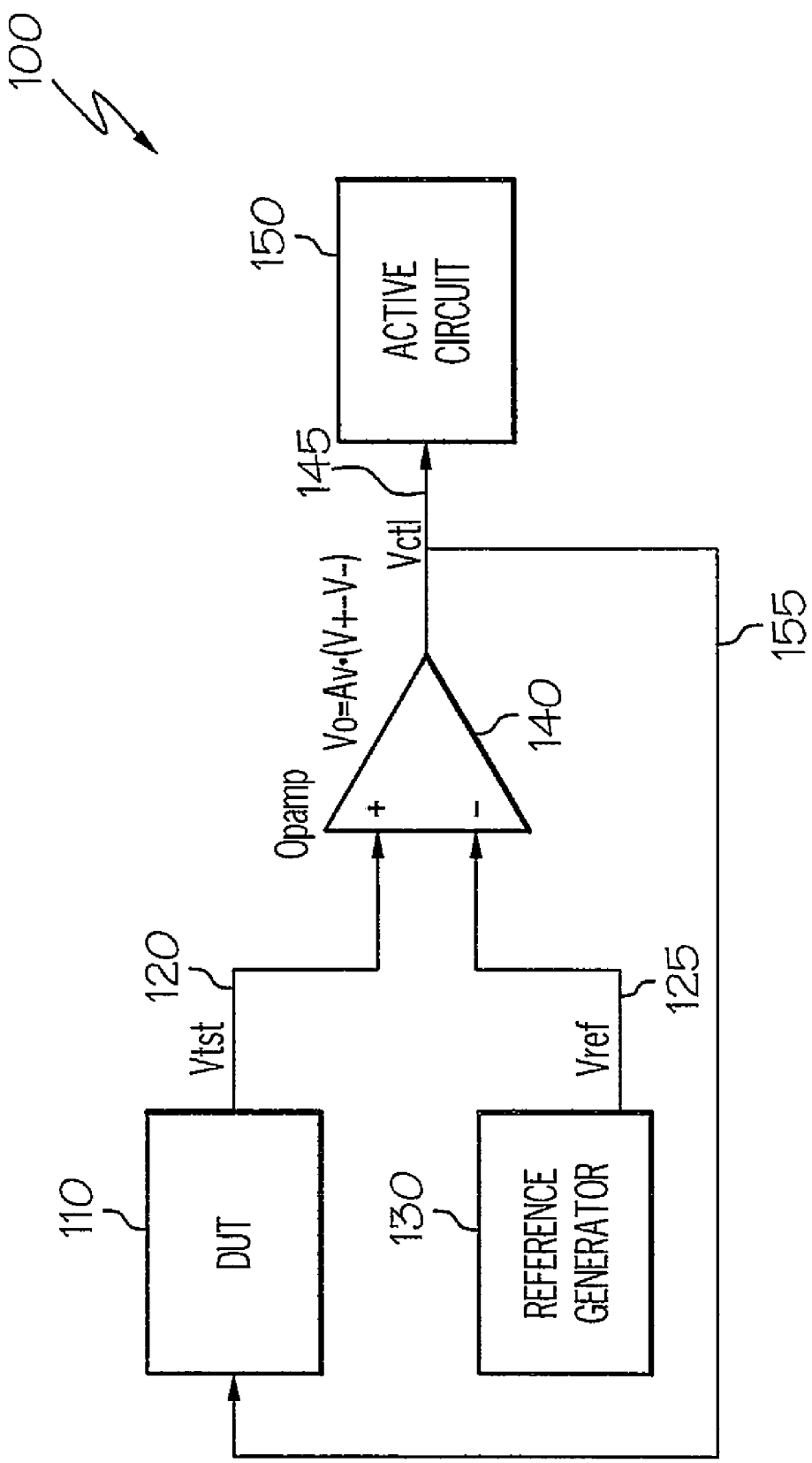
FIG. 1 is a basic feedback circuit with a continuous feedback loop that may be utilized to provide the calibration function according to one embodiment of the invention.

With reference now to the figures, FIG. 1 provides a block circuit diagram illustrating basic calibration of a DUT in a continuous feedback loop configuration. The feedback loop enables a continuous approach to the DUT calibration. As illustrated, DUT 110 provides an output test voltage (Vtst) 120, which is applied as a first input to an operational amplifier (Op AMP) 140. Op AMP 140 receives a second input, reference voltage (Vref) 125 from reference generator 130. At Op AMP 140, output voltage (Vo) is generated as voltage gain (Av) (of Op AMP 140) multiplied by the difference between Vtst 120 (which is shown as upper (+) input) and Vref 125 (which is shown as the lower (−) input). This calculated output voltage is represented as control voltage (Vctl) 145, which is provided to DUT 110 via feedback loop 155.

DUT 110 exhibits change in electrical characteristics due to small changes to Vctl 145 due to changes in Vtst 120. By providing Vctl 145 to DUT 110 via feedback loop 155, the calibration mechanism is able to continuously adjust the value of the Vctl 145 until a desired characteristic (e.g., Vtst=Vref) is measure or exhibited by the DUT 110 (as determined by the value of Vtst 120). The resulting value of Vctl 145 is applied to active circuit 150 which consequently exhibits the desired behavior. DUT 110 is representative of active circuit 150 such that when Vctl 145 is applied to active circuit 150, active circuit 150 exhibits the same (or scaled) electrical characteristics as DUT 110.

Operation of the circuit occurs as follows. Active circuit 150 is controlled by a small-signal voltage (i.e., Vctl 145). DUT 110 generates a small-signal test voltage (i.e., Vtst 120). Vtst 120 and reference voltage, Vref 125, are applied to Op AMP 140. Op AMP 140 has voltage gain Av and transfer characteristic $Vo=Av*(V+ - V-)$. In ideal operating environments, Av approaches infinity, and as Av approaches infinity, Op AMP 140 forces Vctl 145 to a voltage that causes Vtst 120 to be substantially equal to Vref 125. Thus, DUT 110 is calibrated to approximate the electrical behavior that produces the desired reference voltage (Vref 125) such that Vref=Vtst. The same small-signal control voltage (Vctl 145) is applied to the active circuit 150, which approximates the desired electrical behavior.

Figure 2:
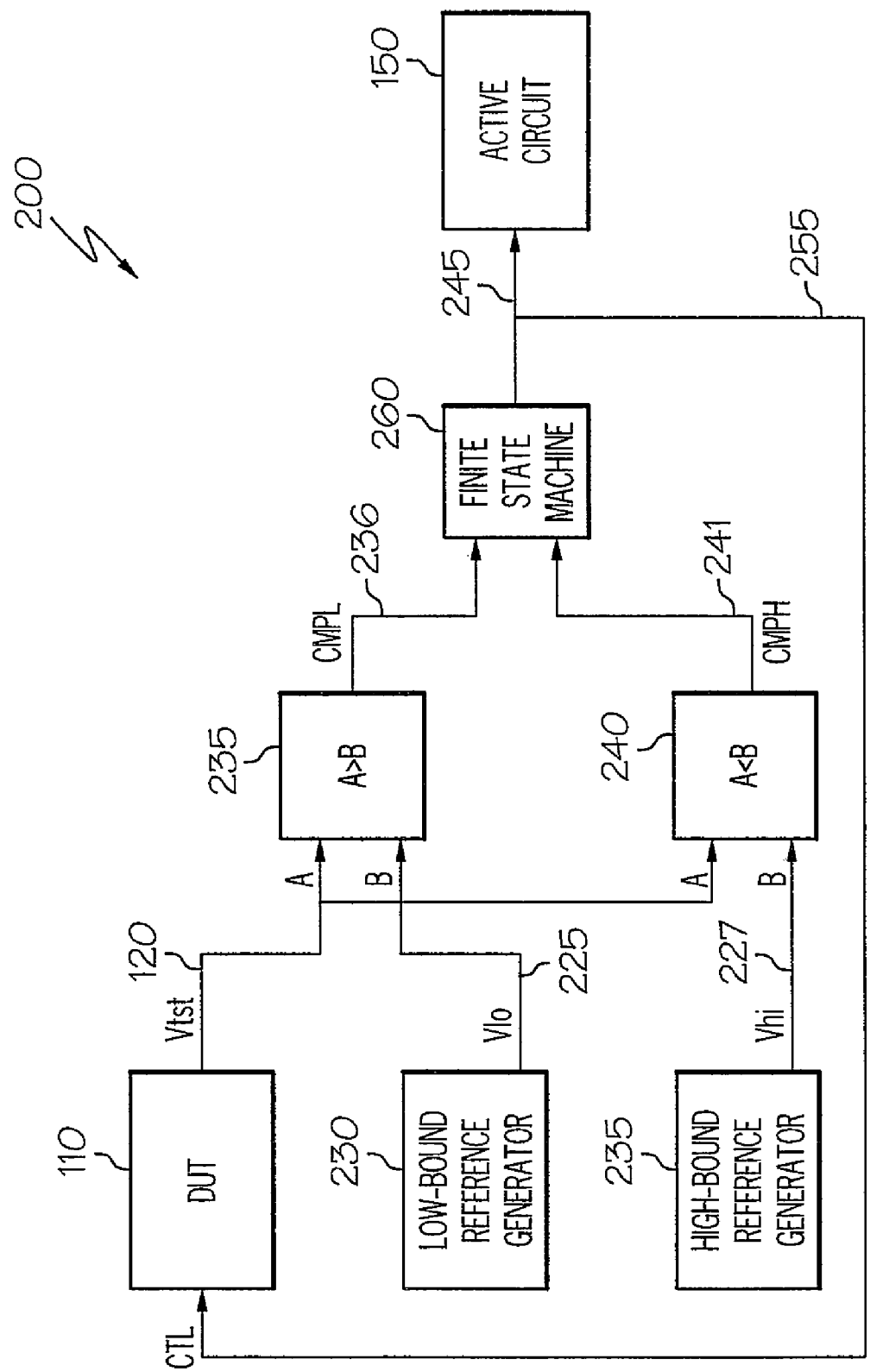
FIG. 2 is a digitized feedback circuit that iteratively provides a feedback control signal to a device under test (DUT) to provide the calibration function according to another embodiment of the invention.

The calibration method provided by FIG. 1 is referred to as a continuous approach. FIG. 2 illustrates a discrete implementation of the calibration method that yields a resulting electrical characteristic which falls within an upper and lower bound. Within the descriptions of the figures, similar elements are provided similar names and reference numerals as those of the previous figure(s). Where a later figure utilizes the element in a different context or with different functionality, the element is provided a different leading numeral representative of the figure number. The specific numerals assigned to the elements are provided solely to aid in the description and not meant to imply any limitations (structural or functional) on the invention.

In FIG. 2, calibration of DUT 110 is completed iteratively via a Finite State Machine (FSM) 260 through logic control signal, CTL 255, (on feedback loop). DUT 110 generates Vtst 120 that is compared to two reference voltages, low reference voltage (Vlo) 225 and high reference voltage (Vhi) 227 at respective comparator circuits. The comparator circuits are low voltage comparator (CMPL) 235 and high voltage comparator (CMPH) 240. Vlo 225 is generated by a low bound reference generator 230, while Vhi 227 is generated by high bound reference generator 235.

Each comparator circuit receives Vtst 120 as a first input, illustrated as input "A" and a second input comprising one of the reference voltages, illustrated as input B. Thus, within each comparator, "B" represents the value of Vlo or Vhi, respectively, while "A" represents the current value of Vtst 120. Each comparator completes a respective comparison for each new value/input of Vtst 120, and each comparator then outputs a 1 or 0 to indicate the result of the comparison. The inequality illustrated indicates the desired value of Vtst 120 and the particular comparison provided by that particular comparator. Both values together indicate the range of the output electrical characteristics being measured. In the illustrative embodiment, an output of 1 for either comparator indicates that the inequality shown within the comparator evaluates as true (i.e., A>B for CMPL or A<B for CMPH), while a 0 indicates the inequality evaluates as false.

Thus, when Vtst 120 is greater than Vlo 225, CMPL 236 is set to a logic high ('1'). Otherwise, CMPL 236 is a logic low ('0'). The inverse conditions apply to CMPH 241, that is logic high (1) is achieve when Vtst 120 is less than Vhi 227 and 0 is achieved when Vtst 120 is greater than Vhi 227. Effectively, Vlo 225 and Vhi 227 are utilized to bound voltage Vtst 120. Finite state machine (FSM) 260 receives logic signals CMPL 236 and CMPH 241 and incrementally sets VCtl 245 accordingly. When both of the comparators provide a 1 at its output, Vtst 120 is within the required range, and FSM 260 stops iterating new values of Vctl 245. Table I below provides an example output and the resulting effects on CTL 245 transmitted to DUT 110 via feedback loop 255.

TABLE I

| CMPL | CMPH | CTL CHANGE |
|---|---|---|
| 0 | 0 | N/A; Off |
| 0 | 1 | Increase Vtst |
| 1 | 0 | Decrease Vtst |
| 1 | 1 | CALIBRATED |

Since the value of Vtst 120 cannot be both less than Vlo 225 and higher than Vhi 227, the "0,0" output is not applicable to the discussion and only applies when the calibration mechanism is turned off. According to the table a "1,1" output is desired, and different changes are made to CTL 245 depending on whether Vtst 120 is below Vlo 225 or above Vhi 227.

FSM 260 processes the logic signals CMPL 236 and CMPH 241 such that Vctl 245 forces the DUT's voltage, Vtst 120, to be greater than Vlo and less than Vhi. Thus, DUT 110 is forced to approximate the electrical behavior (e.g., impedance) that produces the desired voltage range. CTL 245 is also applied to active circuit 150, which approximates the desired electrical behavior. In the illustrative embodiments, the calibration mechanism operates as a voltage divider. The mechanism is applicable to other types of circuits that require calibration.

Figure 3:
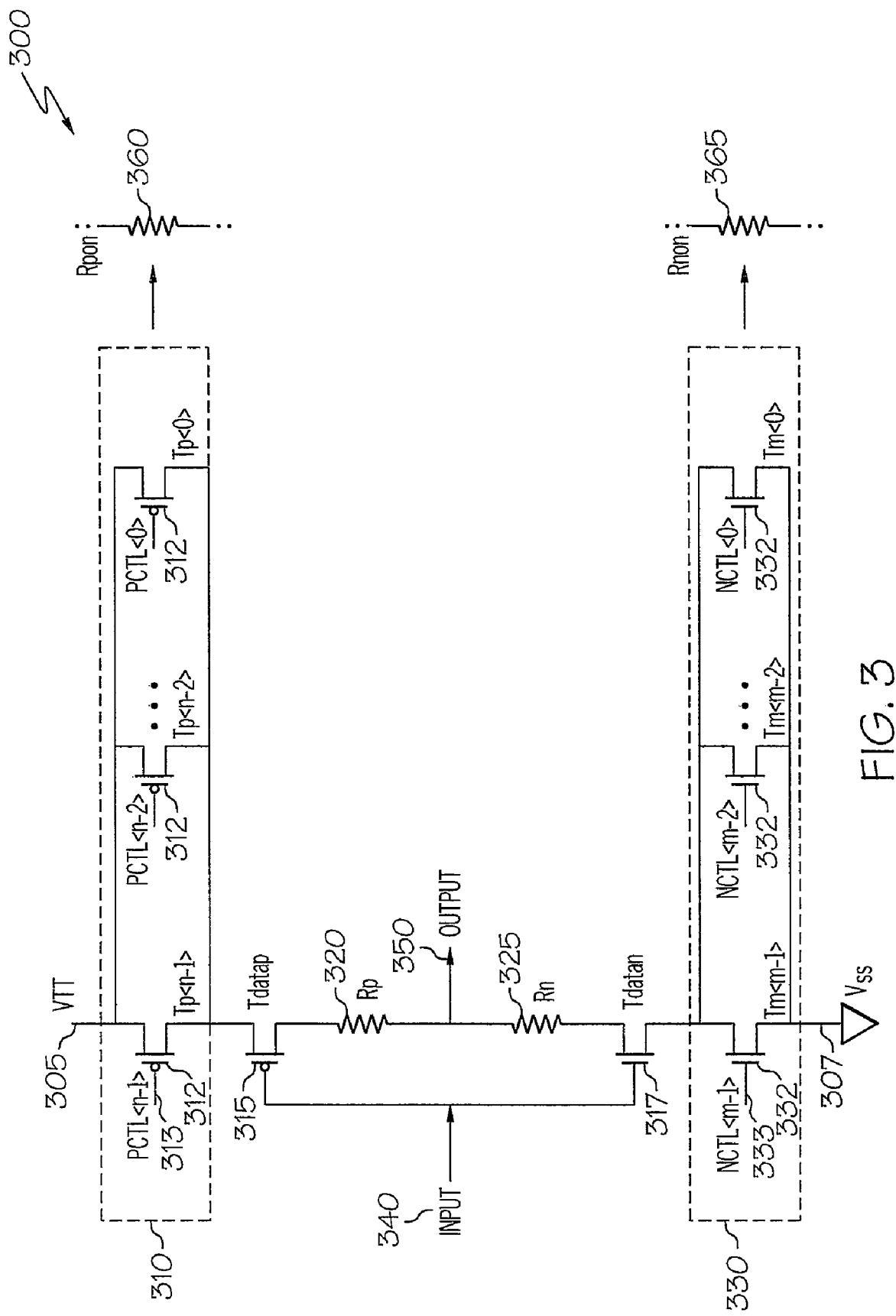
FIG. 3 is an exemplary inverter circuit having parallel branches of transistors series-connected to a resistance to provide the output impedance that requires calibration utilizing the calibration mechanism of FIG. 2, in accordance with one embodiment of the invention.

FIG. 3 illustrates an exemplary circuit that is utilized as the active circuit that requires calibration, according to one embodiment. According to the embodiment, the active circuit is a controlled-impedance CMOS circuit (also referred to as an impedance-controlled inverter or SST driver) 300. In the illustrated embodiment, the calibration features of the invention are applied to a replica SST driver segment of the active circuit, which replica segment is calibrated against an accurate resistor. That is, the DUT in the illustrative embodiments is a replica of the top portion or bottom portion of the active circuit illustrated by FIG. 3.

As illustrated, SST driver 300 is configured with parallel FET fingers (i.e., the FET is broken into many parallel fingers), such that the FET may be trimmed to the allocated impedance for a given process and voltage corner. The sizes of the fingers are such that the change in the parallel FET impedance is monotonic when the total FET impedance approaches the desired value.

During implementation, the FET impedance is allocated to be a preset percentage of the total impedance relative to the series resistor (i.e. 20% FET versus 80% resistor) such that the required accuracy is met with a reasonable number of FET fingers. Notably, this configuration limits the size of the driver output stage, which is important due to bandwidth and ASIC core size constraints.

Referring specifically to the FIG. 3, SST driver 300 comprises a pull-up (PFET) circuit and a pull-down (NFET) circuit, receiving the same input 340 but exhibiting inverted output voltage characteristics relative to each other. Pull-up circuit (also illustrated by FIG. 4, described below) is the portion illustrated at the top of SST driver 300, and comprises P-type input transistor (Tdatap) 315, connected at its source to a parallel branch 310 of N×P-type transistors (e.g., PFETs) 312, where N is an integer number of the total number of parallel PFETs 312, numbered $Tp_0$-$Tp_{N-1}$. Each PFET 312 receives a corresponding control input signal 313 as its gate input. PFETs 312 are connected at their source to a high voltage (VTT) 305 and at their drains to the source of input transistor 315.

The impedance of Tdatap is very small and negligible to the total impedance of the pull-up circuit. Further, when SST driver 300 is in a pull-up operational mode (P-FETS are on), Tdatan impedance approaches infinity. Conversely, when SST driver 300 is in the pull-down mode (N-FETS are on), Tdatap impedance approaches infinity. Parallel-connected PFETs 312 provide collective impedance referred to herein as Rpon 360, which is shown merely for illustration and simplicity of the description since Rpon 360 is not a physical component within circuit 300. The collective impedance value of Rpon 360 is variable depending on the number of PFETs 312 that are turned on, which is in turn controlled by the (on/off) values of the corresponding control inputs 313.

Coupled to the drain of Tdatap 315 is resistor (Rp) 320, which is in turn connected at its other end to output node for output terminal 350. In one embodiment, Rp 320 exhibits resistive characteristics of +/−10%. When "on" input 340 is applied across the gate of Tdatap 315 and one or more of PFETs 312 are turned on, the output node sees an output impedance equal to Rp 320 plus the impedance value of Rpon 360 (with the impedance of Tdatap 315 being negligible).

Pull-down circuit (also illustrated by FIG. 5, described below) is the portion illustrated at the bottom of circuit 300, and is very similarly configured to pull-up circuit except that the transistors are all N-type transistors and the lower parallel branch 330 comprises M×N-type transistors, where M is an integer value that may be different from N. Thus circuit 300 does not necessarily have the same number of P-type transistors and N-type transistors, particularly within the respective parallel groups. Notably, while the transistors within each circuit is described as PFETS and NFETs, respectively, those skilled in the art appreciate that the particular circuit configuration and calibration features of the invention may apply to other types of transistors other than FETs. Specific reference to FETs is thus not meant to imply any limitation on any aspect of the invention or application thereof to a circuit/device to be calibrated.

As shown by FIG. 3, pull-down circuit comprises N-type input transistor (Tdatan) 317 that is connected at its drain to parallel grouping 310 of M×N-type transistors (NFETs) 332, where M is an integer number of the total number of NFETs 332, numbered $Tn_0$-$Tn_{M-1}$. Each NFET 332 receives a corresponding control input signal 333 as its gate input. NFETs 310 are connected at their drains to a low voltage (VSS) 307 and at their source to the drain of input transistor (Tdatan) 317. The impedance of Tdatan 317 is very small and negligible to the total impedance of the pull-down circuit. NFETs 332 provide collective impedance referred to herein as Rnon 365 (which is again shown merely for illustration and simplicity of the description since it is not a physical component within circuit 300). The collective impedance value of Rnon 365 is variable depending on the number of NFETs 332 that are turned on, which is in turn controlled by the (on/off) values of the corresponding control inputs 333.

Coupled to the source of Tdatan 317 is resistor (Rn) 325, which is in turn connected at its other end to output node 350. When "on" input 340 is applied across the gate of Tdatan 317 and one or more of NFETs 332 are turned on (via control input 333), output node sees an output impedance equal to Rn 325 plus the impedance value of Rnon 365 (with the impedance of input transistor 317 being negligible).

Operation of the above circuit 300, which is relevant to its utilization as a device under test and/or active circuit is as follows. For an input voltage of VTT (i.e., a digital '1'), Tdatan 317 is turned on, and Tdatap 315 is off. The M parallel NFETs act as switches that are on or off as dictated by the logic control bus NCTL<m−1:0>. Each parallel NFET 332 has an on-impedance Rnon<i> for i=[m−1, m−2, ..., 0]. Each control bit 333 is a digital '1' or '0'.

At this operational state, the output impedance of SST driver's pull down circuit is equal to the sum of the resistance Rn 325 in series with the M parallel NFETs Tm<m−1>, Tm<m−2>, ..., Tm<0>. With the impedance of Tdatan 317 assumed to be negligible, the effective impedance of the parallel NFETs is denoted Rnon 365 and determined as follows:

[NCTL<m−1>*1/Rnon<n−1>+NCTL<n−2>*1/
  Rnon<n−2>+ . . . +NCTL<0>*1/Rnon<0>]$^{−1}$.

With this value of Rnon 365, the output impedance of SST driver's (or inverter circuit's) pull down circuit is Rn+Rnon.

Figure 4:
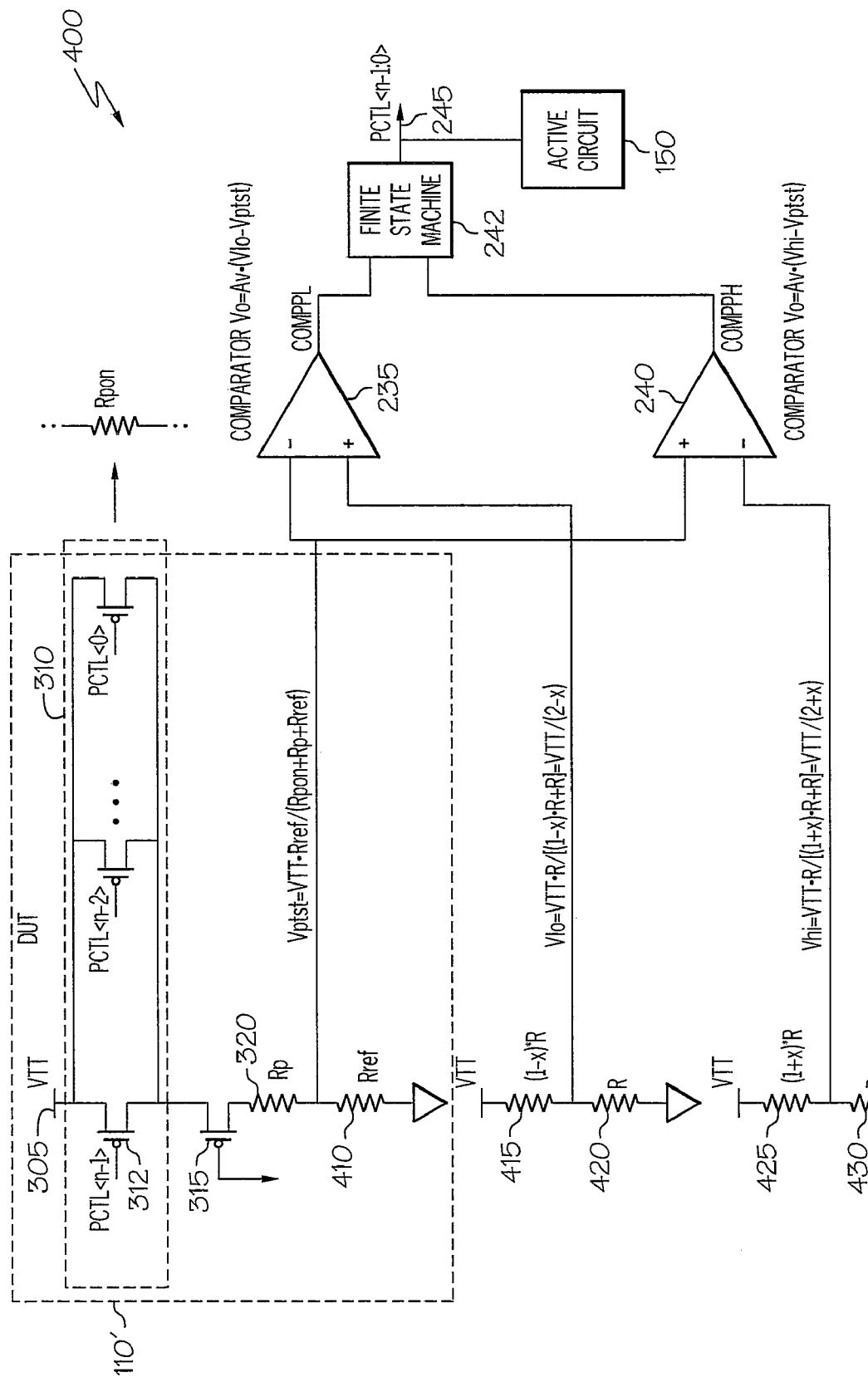
FIGS. 4 and 5 illustrate respective pull-up and pull-down branches of the inverter circuit of FIG. 3 being calibrated utilizing the calibration mechanism of FIG. 2 in accordance with one embodiments of the invention.
Figure 5:
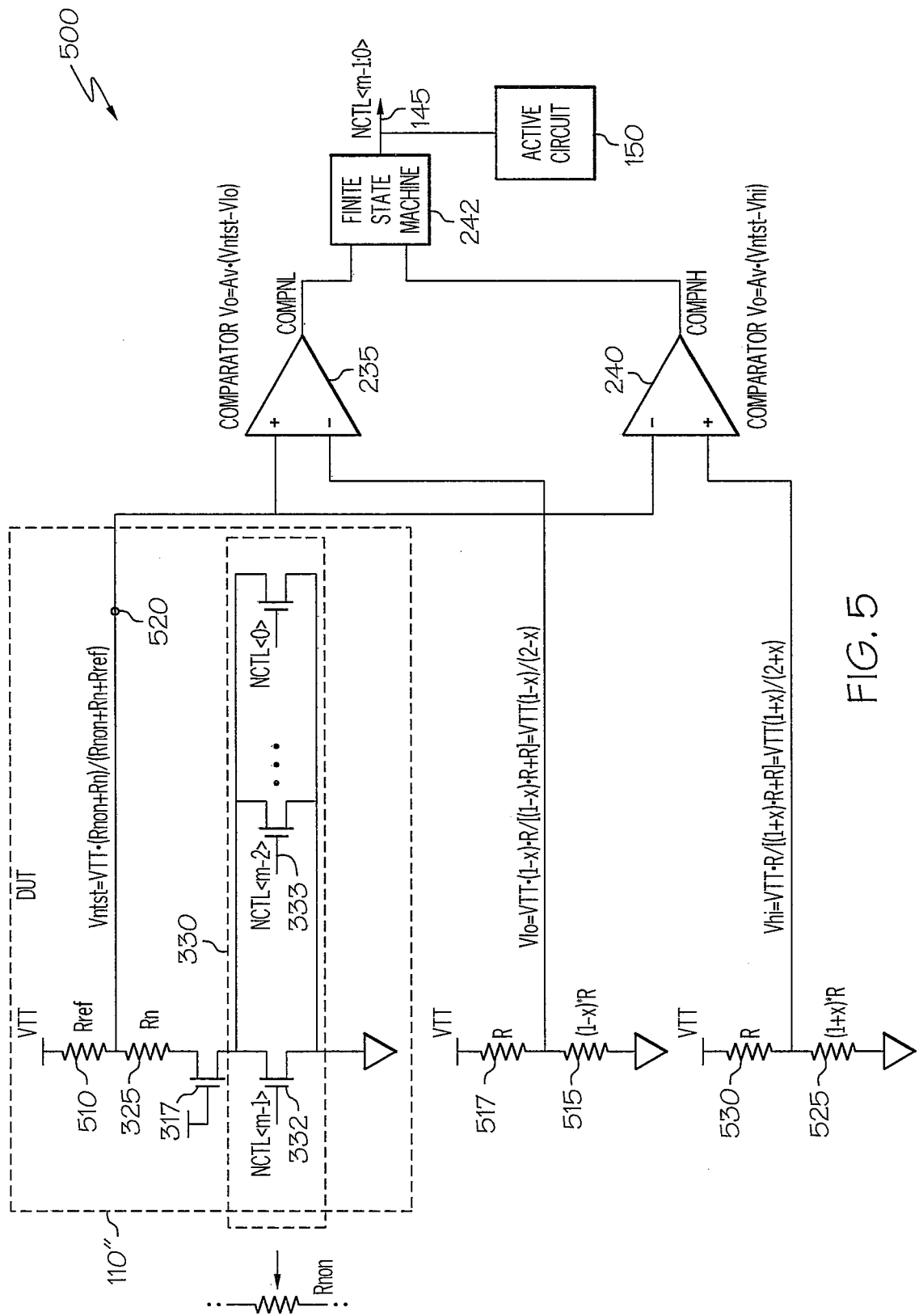

For an input voltage of VSS (or a digital '0'), the input PFET Tdatap 315 is turned on, and the NFET Tdatan 317 is off. In this operational state, the output impedance of SST driver's pull up circuit is derived in a similar manner to be Rp+Rpon. As stated above, the number of parallel PFETs may differ from the number of parallel NFETs, but for simplicity, M is assumed to be the same as N. To achieve a desired output impedance for the impedance-controlled inverter of FIG. 3, the logic control buses NCTL<m−1:0> and PCTL<n−1:0> must be set to turn one or all of the respective devices on (or off). Applying the calibration mechanism of FIG. 2 to the circuit of FIG. 3 provides a discrete approach to setting the control busses 313/333 and ultimately calibrating the inverter's output impedance characteristics. FIG. 4 and FIG. 5 illustrate the calibration mechanism of FIG. 2 individually applied to pull-up and pull-down circuits of FIG. 3.

As described below, the pull-up or pull-down circuit of above SST driver 300 is calibrated against another reference resistor (Rref). Then, the FET impedance in series combination with a resistor is calibrated to be Rref plus-or-minus (+/−) a pre-selected/determined tolerance (e.g., +/−10%). When applied to the calibration mechanism, the PFET and NFET portions of the SST driver segment are separated into independently calibrated halves. Each FET-resistor combination is placed in a voltage divider configuration with Rref, and the resulting voltage, Vtst, is compared to a reference voltage. A state machine observes the comparator output and sets the FET controls appropriately. When the output signal from the comparator is substantially zero, indicating both inputs are substantially the same, the resistance of the FET-resistor combination correctly matches Rref. When the output is not zero, then the controller adjusts the setting of the variable resistor (FET resistance) by turning on/off one or more of the FETs (fingers) within the particular parallel branch.

As shown by FIG. 4, the pull-up circuit is connected as the DUT 110' of the calibration circuit illustrated by FIG. 2. Rp 320 is connected to a reference resistor, Rref 410, with the node at which the resistors connect providing the signal Vptst 420. Additionally, each reference generator is represented as a series-connected pair of resistors, with the first resistor, f(R) 415/425, connected at one end to VTT and the second resistor, R 417/430, connected to a lower voltage source. As provided by the figure, f(R) is a resistor that is some percentage (x %) higher or lower than R 417, where f is a function that adds/subtracts x % to provide a range of resistance around the value of R 417. Thus, for the low bound reference generator 230, f(R)=(1−x)*R, while for high-bound reference generator 235, f(R)=(1+x)*R. In the illustrative embodiment, x is assumed to be 10%.

Comparators 235 and 240 compare Vptst 420 against the reference voltages Vlo 425 and Vhi 427, respectively. COMPPL=Av*(Vlo−Vptst) and COMPPH=Av*(Vptst−Vhi). COMPPL, COMPPH='11' when Vxtst range is Vlo>Vptst and Vhi<Vptst. Under this condition, Rpon+Rp>(1−x)Rref and Rpon+Rp<(1+x)Rref. When this condition is not met, however, adjustments are made to Vctl 245 and COMPPL, COMPPH='11' when the desired value of Vtst is found.

As with the comparison described above with reference to FIG. 2 and Table I, if Vptst 420 is less than Vlo 425, then the output COMPPL is '1'. Also, when Vptst 420 is greater than Vhi 427, then the output COMPPH is '1'. That is, if Vlo>Vptst and Vptst<Vhi, then COMPPL, COMPPH='11' and Vptst is calibrated within the desired range. The methodology for determining the condition where Vptst is less than Vlo involves setting VTT*Rref/(Rpon+Rp+Rref)<VTT/(2−x), then solving for Rpon+Rp, as follows:

VTT*Rref/(Rpon+Rp+Rref)<VTT/(2−x)

1/(Rpon+Rp+Rref)<1/(Rref(2−x))

Rpon+Rp+Rref>Rref(2−x)

Rpon+Rp>(1−x)Rref

With the above, Vptst is less than Vlo when Rp+Rpon>(1−x)Rref. Then, solving Vptst>Vhi gives Rpon+Rp<(1+x)Rref. When the above analysis is completed, the comparators provide COMPPL, COMPPH='11' only when (1−x)*Rref<Rpon+Rp<(1+x)*Rref.

Once the results are outputted by comparators 235 and 240, COMPPL and COMPPH are evaluated by FSM 242. FSM 242 alters the control bus PCTL<n−1:0> 245 (by reducing the overall impedance of DUT 410) until the condition COMPPL, COMPPH='11' is met. Reduction of the overall output impedance (Rpon+Rp) involves switching "on" one or more additional parallel transistors 312 to reduce the value of Rpon. For calibration that requires increasing the value of the output impedance (i.e., where Rpon+R<Rlo), one or more of the (currently on) parallel transistors 312 are switched off. Switching the transistors on or off is controlled by control input 313, which is a discrete signal received from PCTL 245.

During actual calibration, one starting point may be when Vtst is low and Rpon+Rp is high, indicating that the PFETS are turned off. By turning on PFETs, using feedback control gate signals, the Rpon+Rp resistance decreases and Vtst increases accordingly. Similarly, the calibration may begin with Vtst high and the resistance value low, indicating that the PFETS are turned on. The value of Vtst is then adjusted by turning off PFETs again via feedback control gate signals until Vtst falls within the range of voltage desired.

As mentioned above, SST driver 300 is calibrated in two stages, with FIG. 4 providing the calibration of the PFET component (i.e., the pull-up circuit). A similar process is applied to the NFET component (i.e., pull-down circuit) within FIG. 5 where DUT 110" represents the pull-down circuit of FIG. 3 series-connected with Rref 510 at VTT. When pull-down circuit is utilized, the process sets NCTL<n−1:0> such that (1−x)*Rref<Rnon+Rn<(1+x)*Rref. Thus, when the SST driver 300 is provided as DUT 110, both control outputs, PCTL<n−1:0> and NCTL<n−1:0> are applied to the active circuit 150 of FIG. 3. The SST driver 300 then has an output resistance bounded by [(1−x)Rref, (1+x)Rref].

Notably, in one implementation, the impedance-controlled inverter described herein is utilized as an SST transmitter fabricated on-chip with the calibration mechanism also integrated on the chip. The transmitter may be a part of a termination network and the calibration mechanism is utilized to calibrate each half of the voltage mode driver. The impedance is measured and adjusted as operating conditions (e.g., temperature) changes. This implementation enables dynamic calibration of voltage mode transmitter so that the transmitter's impedance matches that of the transmission channel to which the transmitter is coupled. This point at which the impedances match (and the point at which the test voltage falls within the desired range) may be referred to as a point of calibration for the circuit.

As a final matter, it is important that while an illustrative embodiment of the present invention has been, and will continue to be, described in the context of a fully functional computer system with installed management software, those skilled in the art will appreciate that the software aspects of an illustrative embodiment of the present invention are capable of being distributed as a program product in a variety of forms, and that an illustrative embodiment of the present invention applies equally regardless of the particular type of signal bearing media used to actually carry out the distribution. Examples of signal bearing media include recordable type media such as floppy disks, hard disk drives, CD ROMs, and transmission type media such as digital and analogue communication links.

While the invention has been particularly shown and described with reference to a preferred embodiment, it will be understood by those skilled in the art that various changes in form and detail may be made therein without departing from the spirit and scope of the invention.

What is claimed is:

1. A method for manufacturing a calibration device for an active circuit on a chip, said method comprising:
    providing an active circuit capable of exhibiting a range of electrical characteristics including a desired electrical characteristic, said active circuit having one or more control input terminals;
    providing a calibration mechanism on-chip with the active circuit, said calibration mechanism generating a control output and comprising a device under test (DUT) configured as a replica of at least one segment of the active circuit and which receives the control output and generates a test output that causes finite adjustments to the control output based on a comparison of the electrical characteristics exhibited by the DUT with a known electrical characteristic; and
    attaching to each control input terminal of the active circuit a corresponding control output from the calibration mechanism, wherein the control output of the calibration mechanism dynamically adjusts control input applied to devices of the active circuit to force the active circuit to exhibit the desired electrical characteristic.

2. The method of claim 1, wherein said calibration mechanism further comprises:
    a first comparator that receives a test voltage as a first input;
    a reference voltage that is coupled to the first comparator as a second input;
    wherein said comparator performs a comparison of the reference voltage to the test voltage and generates a comparative output indicating the result of the comparison; and
    a finite state machine that receives as input the comparative output and generates the control input; wherein when the comparative output is a first value indicating the test voltage meets a pre-determined criteria, said control input is provided to the active circuit and when the comparative output is a second value indicating the test voltage does not meet the pre-determined criteria, said control input is provided to the DUT to adjust the test voltage closer to a point of calibration, wherein said predetermined criteria is one that leads to the active circuit exhibiting the desired electrical characteristic.

3. The method of claim 2, said calibration mechanism further comprising:
    a second comparator that receives the test voltage as a second input;
    a second reference voltage that is coupled to the second comparator as a first input;
    wherein said second comparator performs a next comparison of the second reference voltage to the test voltage and generates a second comparative output indicating the result of the next comparison;
    wherein said finite state machine also receives as input the second comparative output and generates the control input relative to the first and second comparative outputs; and
    wherein when the second comparative output is a first value indicating the test voltage meets a pre-determined criteria, said control input is provided to the active circuit and when the second comparative output is a second value indicating the test voltage does not meet the pre-determined criteria, said control input is provided to the DUT to adjust the test voltage closer to the point of calibration.

4. The method of claim 1, wherein:
    the DUT is one segment of a source series terminated (SST) serial link transmitter configured with a pull-up circuit and a pull down circuit;
        said pull up circuit comprising a plurality of parallel-connected P-transistors collectively coupled in series to a first resistor through an input P-transistor;
        said pull down circuit comprising a plurality of parallel-connected N-transistors collectively coupled in series to a second resistor through an input N-transistor;
    when said segment utilized as the DUT is the pull up circuit: said test voltage is a voltage measured at a node between the pull up circuit segment and a first reference resistor of known resistance; and said calibration mechanism performs calibration of the DUT until the test voltage falls below a preset low voltage or rises above a preset high voltage; and
    when said segment utilized as the DUT is the pull down circuit: said test voltage is a voltage measured at a node between the pull down circuit segment and a second reference resistor of known resistance; and said calibration mechanism performs calibration of the DUT until the test voltage rises above the preset low voltage or falls below the preset high voltage.

5. The method of claim 4, wherein:
    when the DUT is a pull-up circuit, the parallel-connected transistors of the DUT and series-connected resistors are coupled to a same high voltage node; and
    when the DUT is a pull down circuit, the parallel-connected transistors of the DUT and series connected resistors are coupled to a same low voltage node.

6. The method of claim 1, further comprising:
    providing a first resistance connected in series to a second resistance that is a preset percentage lower than the first resistance, said first resistance and said second resistance connected at a node from which a first voltage is received, said first voltage representing a low voltage for comparing to the test voltage; and
    providing a third resistance connected in series to a fourth resistance that is a preset percentage higher than the first resistance, said first resistance and said second resistance connected at a node from which a second voltage is received, said second voltage representing a high voltage for comparing to the test voltage;
    wherein a test voltage is desired to be within the voltage range bounded by a low voltage and a high voltage.

7. The method of claim 1, wherein:
    said active circuit is a source series terminated (SST) serial link transmitter configured with parallel branches of transistors collectively connected in series to a resistor through an input transistor; and
    said DUT is a replica of at least one segment of the SST transmitter.

* * * * *